United States Patent
Aipperspach

(10) Patent No.: US 6,833,737 B2
(45) Date of Patent: Dec. 21, 2004

(54) SOI SENSE AMPLIFIER METHOD AND APPARATUS

(75) Inventor: Anthony Gus Aipperspach, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/355,682

(22) Filed: Jan. 30, 2003

(65) Prior Publication Data

US 2004/0150470 A1 Aug. 5, 2004

(51) Int. Cl.[7] .............................................. G01R 15/00
(52) U.S. Cl. .............................. 327/55; 327/54; 327/57
(58) Field of Search ............................ 327/51, 52, 54, 327/55, 57; 365/205, 207

(56) References Cited

U.S. PATENT DOCUMENTS

| 6,433,589 B1 | * | 8/2002 | Lee | 326/115 |
| 6,476,645 B1 | * | 11/2002 | Barnes | 327/51 |
| 2001/0043087 A1 | * | 11/2001 | Miyatake et al. | 327/55 |

* cited by examiner

*Primary Examiner*—Long Nguyen
(74) *Attorney, Agent, or Firm*—Carr LLP; Robert M. Carwell

(57) ABSTRACT

Disclosed is an apparatus and method for decreasing the timing delay variation of output signals obtained from an SOI technology sense amplifier. The cross-coupled latch includes FETs where the body is connected to one of source and drain to minimize switching history effects while the input FETs have a higher than normal gate switching voltage to increase input signal sensitivity.

17 Claims, 2 Drawing Sheets

SOI SENSE AMPLIFIER METHOD AND APPARATUS

TECHNICAL FIELD

The invention relates to an SOI (silicon on insulator) sense amplifier design and, more particularly, to improving clocking, sense history and loading characteristics.

BACKGROUND

Typically, high density, high performance SRAM (Static Random Access Memory) signal state detection circuit designs rely on small signal sense amplifiers to detect the state of a stored value. Several approaches are available to the SRAM designer. When SRAM circuit design transitioned from bulk technologies to SOI technologies, sense amplifiers FETs (Field Effect Transistor) required the addition of body contacts to maintain matching between the sensing devices inside the sense amplifier.

One prior art traditional cross-coupled inverter sense amplifier approach used requires synchronization of the bitline precharge and the sense amplifier timing.

A prior art SOI sense amplifier circuit design approach had the advantage of only having gate loads on the small signal inputs. The approach also allowed for different timings between pre-charging of the small signal inputs and the output of the sense amplifier itself. Such an amplifier used cross-connected inverters operating in a latch node that is triggered during a different portion of the cycle than the pre-charging. As known to those skilled in the art, SOI FETs typically have the body floating (ungrounded), as opposed to bulk technology FETs. The floating body of the FET can cause a history problem in that such FETs receiving a plurality of logic ones become biased in a given direction and require a much longer time than typical to react to a logic zero input. Thus, timing becomes critical in high performance circuits.

One might expect to minimize this history problem by connecting the bodies of critical FETs to ground (body contact FETs). However, when the body of an SOI FET is grounded, the reaction time to a signal input is reduced. Further, in such a circuit, the history related voltage buildup on the latch portion of the sense amplifier affects the timing of the output (reaction time is voltage dependent). Additionally, a grounded body contact FET has a lower input signal sensitivity than does an ungrounded SOI FET.

It would thus be desirable to have a sense amplifier that does not need synchronized clocks, can be relatively insensitive to the variable delay related to history problems and has a higher sensitivity to input signals than prior art circuits.

SUMMARY OF THE INVENTION

The present invention comprises using grounded body FETs in combination with high threshold input voltage FETs to provide an improved sense amplifier.

BRIEF DESCRIPTION OF THE DRAWINGS

For a more complete understanding of the present invention, and its advantages, reference will now be made in the following Detailed Description to the accompanying drawings, in which.

DETAILED DESCRIPTION

Figure 1:
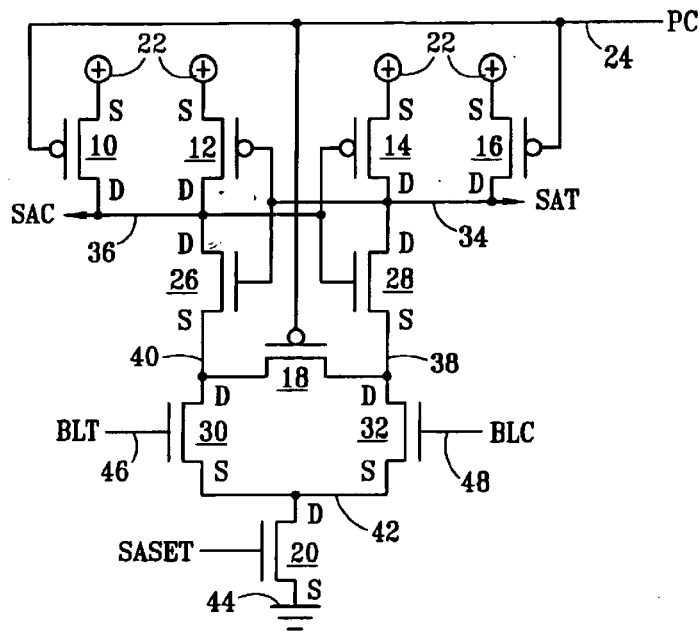
FIG. 1 is a circuit diagram of a prior art sense amplifier.

In FIG. 1, a plurality of P-type or P-channel FETs (field effect transistors) 10, 12, 14, 16, and 18 are shown. Each of these designated FETs, as well as the remaining FETs in the figure, have designators "s" and "d" for source and drain terminals, respectively. FETs 10, 12, 14, and 16 each have their source terminal connected to a positive voltage designated as 22. The gates of each of FETs 10, 16 and 18 are connected to a lead 24 that provides a PC (pre-charge) signal. This signal may be identical to that shown as a PC (pre-charge) signal, a waveform representation of which is further illustrated in FIG. 2.

Figure 2:
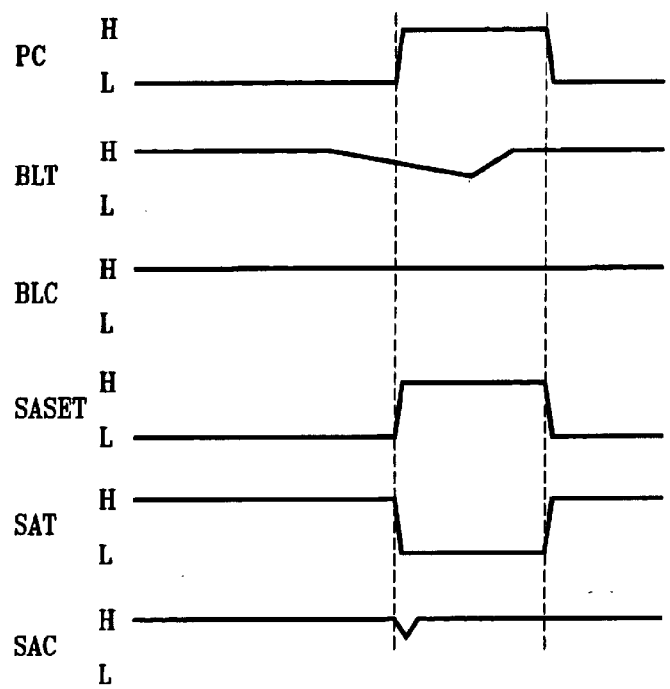
FIG. 2 comprises a set of waveforms used in conjunction with an explanation of operation of the circuit figures.

An N-type FET 20 is shown having the SASET (Sense Amplifier SET) signal of FIG. 2 supplied to a gate thereof. Further N-type or N-channel FET transistors are labeled as 26, 28, 30, and 32. As known to those skilled in the art, P-type FETs act as closed switches or, in other words, turn ON to allow current flow from source to drain when the gate terminal is at a low or negative potential with respect to the source. When the gate potential is positive or the same as the source, the FET is OFF or, in other words, does not conduct electricity. On the other hand, N-type FETs act as closed or ON switches to allow current flow therethrough when the gate terminal is high or positive with respect to the source. An output lead 34, further labeled as SAT (Sense Amplifier True) is connected to the drains of FETs 14 and 16, to the drain of FET 28 and to the gates of FETs 12 and 26. An output lead 36, further labeled as SAC (Sense Amplifier Compliment), is connected to the drains of FETs 10 and 12, to the drain of FET 26 and to the gates of FETs 14 and 28. A lead 38 is connected to the source of FET 28 and to the drain of FET 32. A lead 40 is connected to the source of FET 26 and to the drain of FET 30. The source and drain leads of FET 18 are connected between leads 38 and 40. A lead 42 interconnects the sources of FETs 30 and 32 and to the drain of FET 20. The source of FET 20 is connected to ground or reference potential 44. FETs 12 and 26, as well as 14 and 28, are physically interconnected to act in the same manner as commercially available CMOS (complementary metal oxide on silicon) FETs. The gate of FET 30 is labeled 46 and receives a BLT (Bit Line True) signal from one memory cell, of a set of memory cells, whose logic value is being sensed. The gate of FET 32 is labeled 48 and receives a BLC (Bit Line Compliment) signal from the same memory cell.

In FIG. 2, a plurality of waveforms, already mentioned above, are shown with initial designators of H and L to indicate High and Low potential values. Two vertical dash lines are also shown to illustrate identical times in associated waveform signals.

Figure 3:
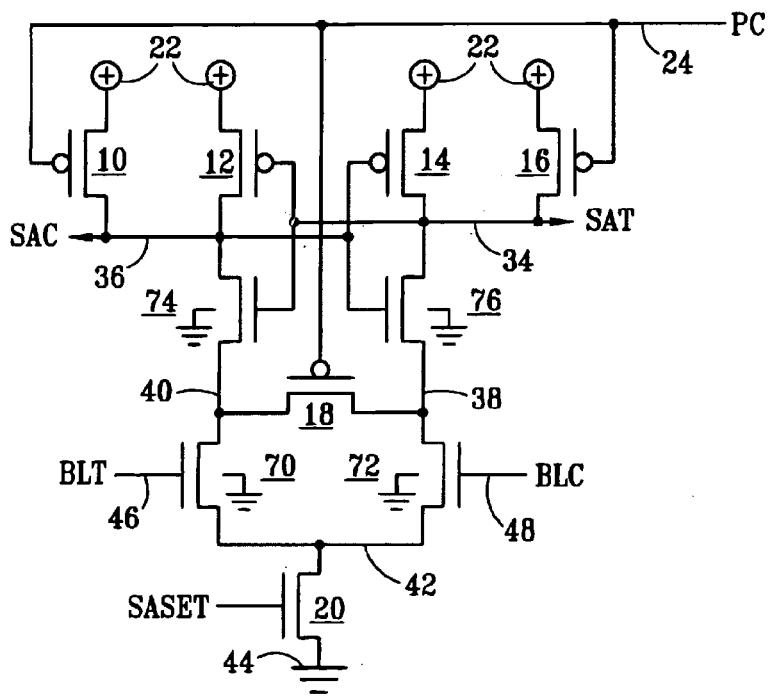
FIG. 3 is a circuit diagram of an initial attempt at improving the sense amplifier of FIG. 1.
Figure 4:
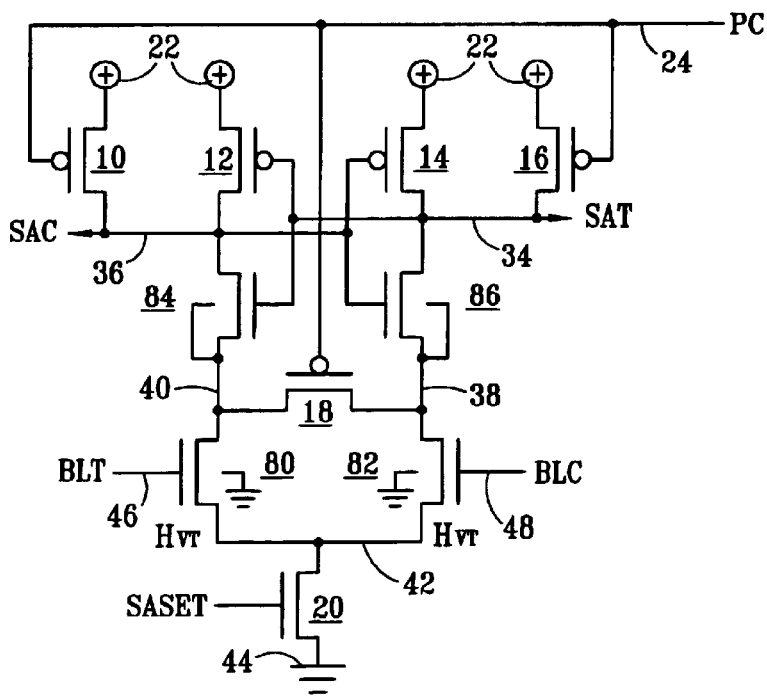
FIG. 4 is a circuit diagram of a preferred embodiment of a sense amplifier in accordance with this invention.

In FIGS. 3 and 4, the same designators are used for instances where components may be identical to those of FIG. 1. As shown, an FET 70 receives the signal BLT. The symbol for FET 70 represents a configuration where the body is connected to ground and is often referred to as a grounded body contact FET. A similar body contact FET 72 receives the BLC signal. The FETs 26 and 28 of FIG. 1 are replaced in FIG. 3 by grounded body contact FETs 74 and 76.

In FIG. 4, a further improvement over FIG. 3, replaces FETs 70 and 72 with Hvt (High threshold voltage) FETs 80 and 82. FETs 80 and 82, therefore, having higher threshold voltage than all other FETs in the circuit. N-type FETs with a high threshold voltage begin to turn ON (or OFF) at a larger source to gate voltage than is the case with typical N-type FETs. Further, the FETs 74 and 76 of FIG. 3 have been replaced in FIG. 4 with FETs 84 and 86. Each of FETs 84 and 86 have the body connected to the source lead of the FET. This type of contact allows the body of the FET to float while equalizing the history effects between these FETs via the pre-charge P-type FET 18 interconnecting them.

In operation, a sense amplifier circuit, of the type shown in each of the figures, reacts to a differential voltage provided between inputs BLT and BLC as obtained from a memory cell logic value. Prior to the time when PC goes high, the FETs 26, 28, 30, and 32 (and those FETs corresponding thereto in FIGS. 3 and 4) are pre-charged to a condition where they will quickly be turned ON. When SASET (and PC) goes high, current begins to flow through the FETs connected to receive BLT and BLC. As shown, BLT has a lower input voltage than BLC at the time SASET goes high. Thus, FET 30 will conduct less current than FET 32. As a result, FET 26 will not pull down on lead 36 (SAC) as hard as FET 28 pulls down on lead 34.

As shown in FIG. 2, initially, both SAT and SAC will fall, but SAT will fall faster. As the voltage SAT falls, it will begin to shut off FET 26 causing more of the current being sourced for the FET 20 to pull down the SAT lead even harder. When FET 26 is OFF, the FET 12 will turn ON and cause lead 36 to pull back to a high level. The two P-type FETs 10 and 16 do not participate in the signal amplification, but are used to pre-charge leads 34 and 36 to insure a good "up" level at the beginning of the next access. The present type of sense amplifier, shown in the various figures, depends upon the current regulation abilities of input signal FETs 30 and 32. As previously mentioned, however, the floating body of the input FETs can cause a history problem in that when the input FETs receive a consecutive plurality of logic ones, the body of the FET typically becomes biased in a given direction. This body voltage bias results in a much longer time, than typical, for the input FETs to react to a logic zero input. Such a variation in delay between input and output signals is detrimental to reliable operation downstream circuitry utilizing these output signals.

By grounding the body of each of the FETs 70, 72, 74, and 76, as shown in FIG. 3, the delay variation is reduced because the body cannot develop a history voltage. However, the grounding of the body of the FETs as shown in FIG. 3 reduces the gain of the circuit to only slightly more than it would be when using bulk technology.

As may be noted in FIG. 4, two improvements have been made over the implementation of FIG. 3. The first is that FETs 84 and 86 have the body connected to the source rather than to ground. This allows the body to float at the same potential as the source terminal to return the gain to that of FIG. 1. However, due to the action of the equalizing FET 18, the history problem is eliminated, thereby minimizing the delay variation in the switching of the output relative the input. The second improvement is in using high threshold voltage FETs for receiving the input signals BLT and BLC. Thus, even though the body is grounded, the effect is to raise the switch point of the FETs closer to the initial pre-charge voltage, since the switching action takes place sooner, thereby effectively raising the gain of the circuit. As may be known, the high threshold voltage reduces the percentage difference overdrive needed between these two FETs, thus providing a greater regulation of the current. Further, since the higher threshold voltage will reduce the maximum current capabilities of these two FETs, the devices should desirably be appropriately increased in physical size. Analysis has shown that, for a given signal, less small signal is required to overcome a mismatch with the circuit of FIG. 4 than the circuit of FIG. 3.

It should noted that while the invention has been explained using N-type FETs to receive the input signal, the invention could also be practiced for using opposite types for each of FETs involved. In other words, substituting N-type FETs for P-type FETs, and visa versa. Such action might well be called for when attempting to sense ground sensed storage elements.

Further, although the invention has been described in connection with SOI technology, the improvements described should be equally applicable to other floating body FET configurations. Although the invention has been described with reference to a specific embodiment, the description is not meant to be construed in a limiting sense. Various modifications of the disclosed embodiment, as well as alternative embodiments of the invention, will become apparent to persons skilled in the art upon reference to the description of the invention. It is therefore contemplated that the claims will cover any such modifications or embodiments that fall within the true scope and spirit of the invention.

What is claimed is:

1. A sense amplifier for use in an SOI (silicon on insulator) system, comprising:

a pair of cross-coupled parallel inverters in a body to source configuration comprising a latch node, each at least configured to operate during portions of a cycle; and a pair of NFET (N-channel Field Effect Transistor) input devices, each interconnected to a different respective one of said inverters, wherein the respective bodies of each of the pair of NFET input devices are connected directly to ground, and wherein each NFET of the pair of NFET input devices has a higher threshold voltage than other NFETs in the amplifier.

2. A sense amplifier, comprising:

a pair of inverters, wherein each inverter comprises a plurality of FETs (Field Effect Transistors), and wherein at least one FET of the plurality of FETs is configured to have the body connected to a source of the at least one FET; and a pair of FET input devices, each interconnected to a different respective one of said inverters, wherein the respective bodies of each of the pair of FET input devices are connected directly to ground, and wherein each input device FET of the pair of FET input devices has a higher threshold voltage than the plurality of FETs.

3. The sense amplifier of claim 2, wherein:

the manufacturing technique used in constructing the amplifier is SOI based;

the at least one FET in each inverter is configured to have the body connected to the source is an NFET.

4. The sense amplifier of claim 2, wherein the FET input devices are NFETs.

5. A sense amplifier, comprising:

a pair of inverters, wherein each inverter comprises a plurality of FETs, and wherein at least one FET of the plurality of FETs is a body contact FET; and a pair of body contact FET signal input devices, each interconnected to a different respective one of said inverters, wherein the respective bodies of each of the pair of FET input devices are connected directly to ground, and wherein the pair of body contact FET signal input devices have a higher threshold than all other FETs in the amplifier.

6. The sense amplifier of claim 5, wherein:
   at least one of said body contact FETs of the inverters each have source and drain terminal portions; and
   at least one of said body contact FETs of the inverters have the body connected to a source terminal portion of the at least one of said body contact FETs.

7. A method of reducing switching delay variations due to input signal history in a sense amplifier, comprising:
   using floating body technology to produce an NFET in each of two inverter portions of the sense amplifier;
   electrically connecting the body of each of said NFET in each of the two inverter portions to a respective source terminal of said NFET; and
   interconnecting a pair of body contact FET signal input devices, to a different respective one of the inverters portions, wherein the respective bodies of each of the pair of FET input devices are connected directly to ground, wherein each body contact FET signal input device of the pair of body contact FET signal input devices is at least configured to have a higher threshold voltage than the NFET in each of the two inverter portions.

8. A sense amplifier having dual inverter portions and input signal portions constructed in accordance with SOI technology, comprising:
   a plurality of body contact configuration input signal FETs comprises at least a part of said input signal portions;
   a body contact configuration NFET in each of said inverter portions, wherein each body contact configuration input signal FETs of the plurality of body contact configuration input signal FETs is configured to have a higher threshold voltage than the body contact configuration NFET in each of said inverter portions; and
   electrical means directly interconnecting the body of said body contact configuration NFET in each of said inverter portions to a respective source terminal of the body contact configuration NFET.

9. A sense amplifier having dual inverter portions and input signal portions constructed in accordance with SOI technology, comprising:
   input signal body contact configuration input signal FETs included in said input signal portions, wherein each input signal body contact configuration input signal FET is configured to have a higher threshold voltage than all other FETS in the amplifier; and
   electrical means directly interconnecting the body of each of said body contact configuration FETs to ground.

10. A method of increasing the gain of an SOI technology sense amplifier, comprising:
    constructing input FETs in the form of body contact devices; and
    connecting the body of said input FETs directly to ground, wherein the body said input FET signal input devices have a higher threshold than all other FETs in the amplifier.

11. An apparatus for sense amplifying, comprising:
    a plurality of cross-coupled inverters; and
    a plurality of FET input devices with a body configuration, wherein each of plurality of FET input devices is at least configured to be individually connected to at least one cross-coupled inverter of the plurality of cross-coupled inverters, and wherein a body of each of the plurality of FET input devices is connected directly to ground, and wherein each of plurality of FET input devices have a higher threshold than all other FETs in the amplifier.

12. The apparatus of claim 11, wherein the apparatus at least is configured to utilize SOI technology.

13. The apparatus of claim 11, wherein the plurality of cross-coupled inverters comprise FETs.

14. The apparatus of claim 13, wherein the plurality of cross-coupled inverters further comprise NFETs.

15. The apparatus of claim 13, wherein the plurality of FET input devices comprises NFETs.

16. The apparatus of claim 14, wherein the plurality of FET input devices comprises NFETs.

17. An apparatus for sense amplifying, comprising:
    a plurality of cross-coupled inverters; wherein each inverter comprises an NFET; and
    a plurality of NFET input devices with a body configuration, wherein each of the plurality of NFET input input devices further comprise:
       at least being configured to be individually connected to at least one cross-coupled inverter of the plurality of cross-coupled inverters;
       a body of each of the plurality of NFET input devices is connected directly to ground; and
       at least being configured to have a threshold voltage greater than a threshold voltage of the NFET in each inverter of the plurality of the cross-coupled inverters.

* * * * *

UNITED STATES PATENT AND TRADEMARK OFFICE
CERTIFICATE OF CORRECTION

PATENT NO. : 6,833,737 B2
DATED : December 21, 2004
INVENTOR(S) : Aipperspach

It is certified that error appears in the above-identified patent and that said Letters Patent is hereby corrected as shown below:

Column 4,
Line 28, delete "parallel"

Signed and Sealed this

Twenty-second Day of March, 2005

JON W. DUDAS
*Director of the United States Patent and Trademark Office*